United States Patent
Auer et al.

(10) Patent No.: US 10,547,313 B2
(45) Date of Patent: Jan. 28, 2020

(54) CIRCUIT ARRANGEMENT FOR A SAFETY IANDC SYSTEM

(71) Applicant: AREVA NP SAS, Courbevoie (FR)

(72) Inventors: Guenther Auer, Erlangen (DE); Johannes Weber, Poing (DE)

(73) Assignee: AREVA NP SAS, Courbevoie (FR)

( * ) Notice: Subject to any disclaimer, the term of this patent is extended or adjusted under 35 U.S.C. 154(b) by 408 days.

(21) Appl. No.: 15/512,765

(22) PCT Filed: Aug. 17, 2015

(86) PCT No.: PCT/EP2015/068873
§ 371 (c)(1),
(2) Date: Mar. 20, 2017

(87) PCT Pub. No.: WO2016/026823
PCT Pub. Date: Feb. 25, 2016

(65) Prior Publication Data
US 2017/0250690 A1    Aug. 31, 2017

(30) Foreign Application Priority Data

Aug. 20, 2014 (EP) .................................. 14181534

(51) Int. Cl.
*H03K 19/177* (2006.01)
*G21D 3/00* (2006.01)

(52) U.S. Cl.
CPC ......... *H03K 19/17768* (2013.01); *G21D 3/00* (2013.01); *H03K 19/17728* (2013.01); *H03K 19/17764* (2013.01); *Y02E 30/39* (2013.01)

(58) Field of Classification Search
CPC ............... G21D 3/00; H03K 19/17728; H03K 19/17764; H03K 19/17768; Y02E 30/39
See application file for complete search history.

(56) References Cited

U.S. PATENT DOCUMENTS

| | | | | |
|---|---|---|---|---|
| 4,949,275 | A * | 8/1990 | Nonaka ............... | G06F 17/5068 257/E27.105 |
| 5,859,884 | A | 1/1999 | Metro et al. | |
| 6,150,841 | A * | 11/2000 | Agrawal .......... | H03K 19/17728 326/39 |
| 6,262,873 | B1 * | 7/2001 | Pequignot ........... | H01L 27/0248 361/111 |
| 6,529,041 | B1 * | 3/2003 | Ng ................... | H03K 19/17744 326/38 |
| 6,724,647 | B1 * | 4/2004 | Sato ........................ | G11C 8/10 365/154 |

(Continued)

FOREIGN PATENT DOCUMENTS

| KR | 101179782 B1 | 10/2011 |
|---|---|---|
| KR | 20110113829 A | 10/2011 |
| WO | 9629763 A1 | 9/1996 |

*Primary Examiner* — Helen Rossoshek
(74) *Attorney, Agent, or Firm* — Laurence A. Greenberg; Werner H. Stemer; Ralph E. Locher

(57) ABSTRACT

A circuit arrangement, in particular for a safety I&C system of a nuclear power plant, keeps a proven diagram-centric project-specific engineering approach known from CPU-based systems while reaping the benefits of FPGA technology. To this end, the circuit arrangement includes:
a generic FPGA with a plurality of logic blocks, and
at least one dedicated PLD which operates as an application-specific switch-matrix for the logic blocks.

20 Claims, 4 Drawing Sheets

(56) References Cited

U.S. PATENT DOCUMENTS

| | | | | |
|---|---|---|---|---|
| 6,798,239 B2* | 9/2004 | Douglass | ............ | G06F 15/7867 |
| | | | | 326/38 |
| 6,844,757 B2* | 1/2005 | Dante | .............. | H03K 19/17732 |
| | | | | 326/38 |
| 6,910,201 B2* | 6/2005 | Byrn | ................... | G06F 17/5045 |
| | | | | 257/204 |
| 7,120,571 B2* | 10/2006 | Shei | ....................... | G06F 11/261 |
| | | | | 703/23 |
| 7,246,285 B1* | 7/2007 | Eldin | .............. | G01R 31/31717 |
| | | | | 714/719 |
| 7,268,581 B1* | 9/2007 | Trimberger | ...... | H03K 19/17736 |
| | | | | 326/38 |
| 7,506,210 B1* | 3/2009 | Bridgford | ........ | G01R 31/31705 |
| | | | | 714/37 |
| 7,669,168 B1 | 2/2010 | Patterson | | |
| 7,673,087 B1 | 3/2010 | Ansari et al. | | |
| 2002/0174411 A1* | 11/2002 | Feng | ................... | G06F 17/5054 |
| | | | | 716/117 |
| 2011/0313580 A1* | 12/2011 | Bakhmach | ............... | G05B 9/03 |
| | | | | 700/292 |
| 2013/0013107 A1* | 1/2013 | Felique | ..................... | G07F 9/00 |
| | | | | 700/244 |
| 2013/0159452 A1* | 6/2013 | Saldana De Fuentes | .................... | |
| | | | | G06F 15/167 |
| | | | | 709/213 |
| 2014/0103985 A1* | 4/2014 | Andreev | ................ | H03K 5/131 |
| | | | | 327/262 |
| 2016/0307655 A1* | 10/2016 | Haddad | .................. | G21D 3/001 |
| 2017/0084088 A1* | 3/2017 | Reichardt | ............. | G07C 5/008 |
| 2018/0190395 A1* | 7/2018 | Clarkson | .................. | G21D 3/04 |

* cited by examiner

CIRCUIT ARRANGEMENT FOR A SAFETY IANDC SYSTEM

BACKGROUND OF THE INVENTION

Field of the Invention

In the nuclear industry there is a strong trend towards FPGA-based safety I&C systems and modules in contrast to currently used CPU-based systems.

FPGAs offer a number of advantages especially in the context of complex systems with many parallel input and output signals. Currently all project-specific engineering tasks for CPU-based I&C platforms can be executed by non-electronics-experts with the help of signal-flow-oriented, human-readable diagrams. A toolchain automatically translates these diagrams into C-code that can be compiled and run on a CPU-based safety I&C system.

This methodology can be qualified for safety applications because the binary results of the whole toolchain are highly predictable. This, however, differentiates a CPU-based approach from an FPGA based approach: due to the nature of FPGAs and their toolchains even small changes on the design entry level may lead to previously unpredictable, completely different timing characteristics of the final chip. Therefore, the safety I&C industry does not follow a diagram-based approach together with an FPGA backend so far. Instead, electronics experts are needed to do the respective FPGA design entry using well-known techniques based on hardware description languages such as VHDL. This leads to either fixed designs that have to be reused under different circumstances or very complex project engineering tasks involving specialists not only from the nuclear application domain but also from the FPGA-design domain. Furthermore, every FPGA-design needs to be qualified very carefully by employing carefully designed development and verification processes.

In another context, beyond the nuclear sector, partial reconfiguration for FPGAs has been proposed. See e.g. U.S. Pat. No. 7,669,168 B1: "Method and apparatus for dynamically connecting modules in a programmable device".

The basic idea here is to have a database of locally pre-routed low-level logic blocks that can individually be combined to a bitstream that configures the FPGA.

In principle, partial reconfiguration would be a solution to the given problem if applied properly, but:

A complex and thus hard to qualify toolchain must cater for this feature which is currently not widely supplied and not very stable.

A certain module only fits into a specific slot (location) on the chip with dedicated connections to certain pins. If e.g. a voting block is needed on pins 1-4 and a filter block is needed on pins 10-20 the necessary module library would have to contain a voting block exactly on those pins (plus voting blocks on other pin combinations). The same applies to filter blocks and all other logic function blocks—so the resulting, prequalified library would have to be very large: All kinds of blocks are needed for a potentially large number of slots.

Slots for blocks that are connected to certain pins have a fixed size—thus a simple gate consumes as much logic resources as a complex filter function. So grouping of size classes for logic blocks would be necessary which will further restrict valid pin-function combinations.

There have been lots of other practical issues with existing tools such as e.g. clock restrictions (not every block may use every clock) or granularity (blocks need to be rather large with specific boundaries—so also large chips can only be divided into a few slots).

Only a few different FPGAs support partial reconfiguration at all—namely flash-based or antifuse-based FPGAs do normally not, which unfortunately are especially suitable for the given context.

All in all, partial reconfiguration is an elegant and powerful solution for a number of problems but does not quite fit to the given situation which explicitly does not need the full power of entirely dynamically (re-) configurable logic blocks but just a few dynamic pin to function-block connections. The primary focus of partial reconfiguration is to dynamically (re-) configure parts of the FPGA after being powered up in the sense of time multiplexing of logic blocks to reduce the needed hardware resources or to cater for in-field updates. This is clearly not planned in the given application. Additionally, it cannot be regarded as mature technology and is therefore hardly suited for nuclear I&C systems which have to be supported for decades.

SUMMARY OF THE INVENTION

Therefore, it is an objective of the present invention to keep the proven diagram-centric project-specific engineering approach while still reaping the benefits of FPGA technology and while avoiding the above-mentioned problems with regard to partial reconfiguration technology.

According to the invention this objective is achieved by a circuit arrangement, in particular for a safety I&C system of a nuclear power plant, disposed on a logic board, the arrangement comprising:
  a generic FPGA with a plurality of logic function units, a set of internal routing resources for interconnections between the logic function units, and a plurality of pins,
  at least one application specific PLD with a plurality of pins, and
  a plurality of point-to-point connections between the pins of the FGPA and the pins of the PLD via circuit tracks of the logic board,
  wherein the internal routing resources of the FPGA are not used to connect the logic functions units with each other, but instead the PLD operates as an application-specific, FPGA-external switch-matrix for the point-to-point connections and hence for the logic function units. The used range of functions provided by the PLD(s) is mainly or exclusively restricted to the role as a switch-matrix for the FPGA.

Preferred embodiments and enhancements are subject of the dependent claims and the subsequent detailed description.

In very simple words, the concept underlying the present invention is an advancement of the general idea that the whole logic to be implemented can be split onto several devices whereas one (or some) of these are fixed and one (or some) of these need to be adapted to project-specific (application-specific) needs.

The basic idea according to the present invention is to limit the degrees of freedom for the project-dynamic FPGA part of the system in order to simplify the tool chain (which also eases qualification).

The approach is based on the idea to develop one or more pre-qualified FPGA designs containing a superset of potentially needed logical functions. In other words, there is a generic, pre-configured FPGA with a number of domain-specific (i.e. suitable for I&C tasks in a nuclear power plant), but application-generic logic functions. These are not adapted to project-specific needs but they can be applied in a flexible-enough way to still employ a diagram-based project-engineering flow by having the possibility to connect the according function units or blocks with each other in a project-specific way.

One precondition is the fact that many current FPGA devices offer vast amounts of logic in comparison to what is typically needed for safety I&C applications. This allows it to develop (and carefully qualify) FPGA designs that contain a superset of logic blocks that may be needed for different projects.

Examples of such designs may have the following characteristics:
- Basic Digital Signals, e.g. includes dozens of: logic functions (AND/OR/XOR . . . ), voting blocks, delay blocks, alarm blocks, backplane bus interfaces . . . .
- Filter and Controller: filter blocks, controller units (PID, PI, . . . ), signal integrator, signal differentiator, RMS units, . . . .
- Special Functions: algorithms, e.g. related to certain nuclear aspects
- Basic Analog Signals, e.g. dozens of: serial digital interfaces (SPI, I2S, . . . ), compare units, calculating units (add, subtract, . . . ), delay blocks, backplane bus interfaces If practical, FPGA master images can of course also contain function blocks from different domains (digital, analog) that are grouped together to befit certain typical applications.

Such master FPGA images can be utilized for I&C applications in the following ways:

A) CPLD Approach

The idea is to combine a large FPGA with a large number of pins (e.g. 500 user I/Os) with one or more CPLDs surrounding it. The FPGA master image(s) are completely frozen and designed in a way that all FPGA pins are connected to well-defined functions. The CPLD(s) work as a programmable switch matrix that connects the e.g. 50-60 input/output pins of the complex logic daughter board to the FPGA pins in a project-specific way, including all connections between several FPGA functions.

Contrary to FPGAs, CPLDs offer a lot less hardware resources (which make them virtually unusable as primary programmable logic device—even for the given application) but they offer strictly predictable timing and hence a comparatively simple tool chain. Only the configuration of the CPLD(s) (plus some pre-programmed reference values if applicable, see below) defines the project-specific function and hence all signal of the FPGA board. Dynamic (=diagram-centric) CPLD tool-chains are therefore a lot more manageable and offering easier qualification than FPGA tool chains. The CPLDs can additionally perform integrity checks, e.g. by constantly reading (and checking) the FPGA configuration or by communicating with other FPGA-implemented integrity-check mechanisms. It is thus possible to develop a project-specific engineering flow that allows the (semi-) automatic creation of respective CPLD images.

Main advantages of this approach include:
- Project-engineering can stay the same as for current CPU-based I&C platforms—(almost) the same front-end schematics can even be implemented diverse CPU-based and FPGA-based.
- FPGA-technology's potential can be almost fully used. Due to the fact that specific functions are tied to specific pins, there may be situations where this approach is inferior to a "classic" FPGA approach.
- By FPGA's standards low project-engineering costs while still having a high degree of flexibility to cater for different project needs.
- Low maintenance effort as only a few master images plus the development tool chain needs to be cared for.
- Conceptually high complexities are feasible—the number of available pins on commercial devices seems to be the limiting factor.

Disadvantages on the other hand include:
- "Real" CPLDs are clearly on the road to obsolescence and might not be readily available in the distant future.
- CPLDs with a high pin count are scarce (if available at all)—thus perhaps more than one CPLD is needed per FPGA.
- Costs of additional CPLD as overhead.

However, the disadvantages do not tangle the feasibility of the concept in a fundamental way and the advantages outweigh the disadvantages by far.

B) External Crossbar Switch Approach/FGPA Approach

Instead of a CPLD, a dedicated crossbar switch IC or even another "marshalling" FPGA—preferably with a very special, tightly controlled tool chain that can only create switch-configuration images—that are configured with the help of a non-volatile memory or a local CPU may be applied.

If a dedicated FPGA is merely used for the marshalling, even a black-box tool chain is usable (this is also true for the CPLD approach described above):
- An automatic VHDL generator creates the needed marshalling matrix code for the FPGA which is compiled to a bitstream by a vendor-specific tool chain.
- In order to qualify project-specific marshalling devices, a generic measurement/qualification system (e.g. PCB) is developed that contains the same type of marshalling device surrounded by test infrastructure. This qualification system only serves the purpose to automatically determine 100% of any switch matrix image's characteristics (e.g. connections-made, input-output-timings) and creates a report thereof. The 100% characteristics determination naturally includes also 100% testing.
- Project engineers need to test their final marshalling-switch image with the help of said qualified, dedicated test hardware (which of course can be re-used) to proof that the black-box tool chain has worked correctly.
- Therefore the complex FPGA tool chain doesn't matter anymore and large, convenient FPGAs can be used instead of old/mature CPLD or other exotic devices.
- Furthermore, obsolescence is also no problem as this concept works for any FPGA as long as there is a qualification/test board for this specific FPGA type available.

This approach has all the advantages of the CPLD approach mentioned above and provides an efficient way to deal with obsolescence as it is not tied to specific devices and can be migrated to other devices for obsolescence or diversity reasons. The disadvantages mainly concern the slightly more complex development of suitable software tools and testing devices.

Besides, Generic Array Logic devices (GALs) may be considered for easy qualification if there are still devices available which will not be discontinued soon.

C) Fuse/Anti-Fuse ASIC Approach

This approach is similar to the previous one with the exception that instead of a marshalling FPGA a one-time programmable fuse/anti-fuse ASIC is proposed. Background to this concept is the fact that fuse/anti-fuse FPGAs offer a number of advantages as they represent real hardware in a way that "programming" them is merely the last step of the hardware fabrication. However, fuse-based FPGAs are not readily available on the market anymore and anti-fuse-based FPGAs are rather expensive. As a remedy, one may resort to developing one's own (custom) fuse/anti-fuse routing device which is rather simple as it needs not contain any logic elements but "only" programmable routes. The needed techniques are rather old and well proven and tested anyway.

Advantages of this approach include:
The marshalling is implemented in real hardware with no power-up issues or single-event upsets that need to be taken into account.
As this solution is one-time-programmable, the achievable level of cyber security is potentially higher than with other solutions.

The related drawbacks might include the corresponding development efforts and long-term stability issues with respect to the ASICs.

D) PCB Approach

This approach is similar to the previous one. It is dedicated to the idea of using a Printed Circuit Board (PCB) instead of a CPLD or FPGA to provide the marshalling for the master FPGA. Again, considerable efforts are to be expected for the development, the fabrication and the qualification of suitable (custom) PCBs. On the other hand the needed techniques are also well proven and tested.

E) Bitstream-Patch Approach:

Within this approach the FPGA is designed similarly to option a) but the function blocks are not connected to FPGA pins. Instead they are routed to well-defined routing switches within the FPGA fabric. FPGAs offer several sorts of wiring resources to interconnect the various parts of the circuit which can be differentiated between local connections and direct connections. These are arranged in a cross-bar-switch architecture, incorporating lots of switches whose setting forms an integral part of the whole FPGA configuration.

The idea behind this approach is it to have a fixed master image that may be altered only by manipulating a predefined, small set of wiring (routing) switches (e.g. 50 pieces on a FPGA possessing thousands of them). This is done directly on configuration-file-level using low-level bitstream manipulation tools. These tools naturally must implement means to ensure integrity of the whole image. The selection of the switches and the fixed routing of all other logic resources must ensure sufficient timing reserves under all circumstances, no matter how the switches are set. The project-specific engineering flow thus supports the static patch of prequalified master FPGA images to cover the application-specific configuration.

F) Programmable Switch-Matrix Approach:

Within this approach the FPGA master image contains additionally a programmable switch matrix (multiplexer) logic block that reads a configuration from an FPGA-external, non-volatile memory and toggles the connection to all logic blocks on the FPGA accordingly. However, the necessary multiplexer-structures are only applicable for a rather small number of inputs and outputs. This not necessarily prevents the usage in the given context as no full NxM crossbar switch is needed: clever partitioning of pins and functions may reduce the necessary logic and routing resources to a manageable amount.

Common to all these ways is that the FPGA may read reference values (e.g. needed for comparators) from a non-volatile memory also connected to the FPGA. If SRAM-based FPGA(s) are used this memory unit may also contain several master images that can be selected by e.g. DIP switches, jumpers, etc. In order to ensure the integrity of reference values and/or images, encryption algorithms may be applied.

In summary, the advantages related to the present invention include but are not limited to the fact that the currently used I&C engineering methodology among CPU-based systems remains usable within the FPGA framework with all its advantages:

No electronics experts for project-specific engineering are needed.
No project-specific HDL-code which is much more difficult to qualify than self-explaining diagrams. This results in massively reduced project-specific engineering costs.
High flexibility with regard to application scenarios in comparison to fixed designs bound to specific reactor types or specific I&C systems and functions.

BRIEF DESCRIPTION OF THE SEVERAL VIEWS OF THE DRAWING

An exemplary embodiment of the invention is subsequently described with respect to the accompanying drawings which depict in a purely schematic and highly simplified manner.

DESCRIPTION OF THE INVENTION

Figure 1:
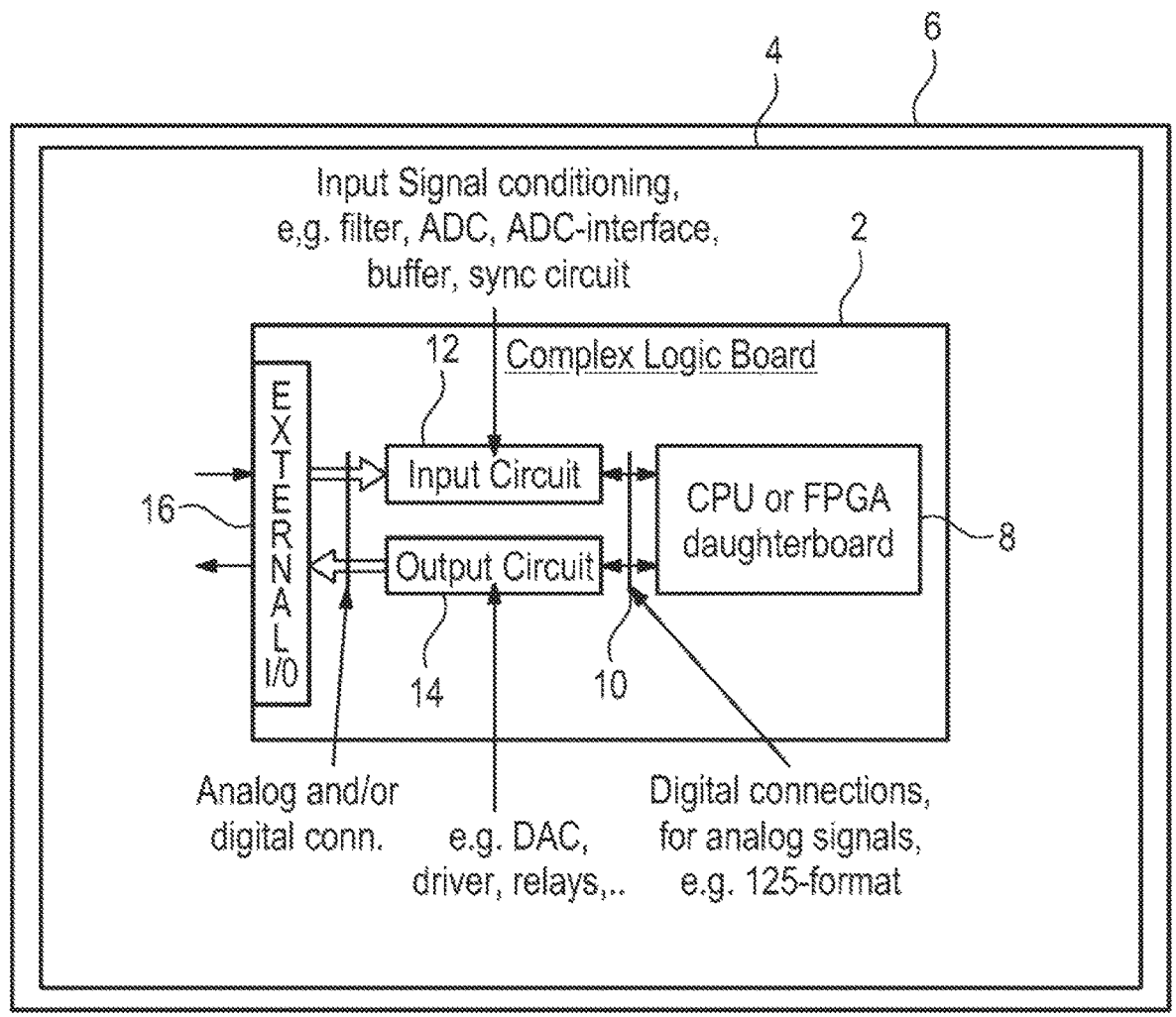
FIG. 1 a complex logic board of a safety I&C system,
FIG. 2 a FPGA-based daughter board of the logic board according to FIG. 1,
FIG. 3 a detail of FIG. 2, and
FIG. 4 a diagrammatic representation of an engineering flow in connection with the development of a circuit arrangement to be implemented on the daughter board according to FIG. 2.

FIG. 1 depicts, in the manner of a rough outline, a complex logic board 2 of a safety Instrumentation & Control (I&C) system 4 to be used in a nuclear power plant 6. This board is also called a motherboard. The actual logic can be implemented on a daughterboard 8 being exchangeable connected to the motherboard 2. Traditionally, the daughterboard 8 (if present) 8 CPU-based, i.e. comprises a Central Processing Unit (CPU) with a fixed instruction set and a sequential work order as the main computing resource. The daughterboard 8 is connected, via a suitable digital interface 10 via connectors, to an input circuit 12 on the one hand and an output circuit 14 on the other hand. The input circuit 12 provides means for conditioning the analog and/or digital input signals provided via external input/output (I/O) connectors 16. These means typically comprise Analog-to-Digital Converters (ADCs), corresponding interfaces, filters, buffers, sync circuits and the like. Correspondingly, the output circuit 14 converts the digital output signals of the daughterboard 8 into suitable analog and/or digital signals for the peripheral devices, in particular actors, that are connect to the motherboard 2 via the external I/O 16. To this end, the output circuit 14 typically comprises Digital-to-Analog Converters (DACs), drivers, relays and the like.

Figure 2:
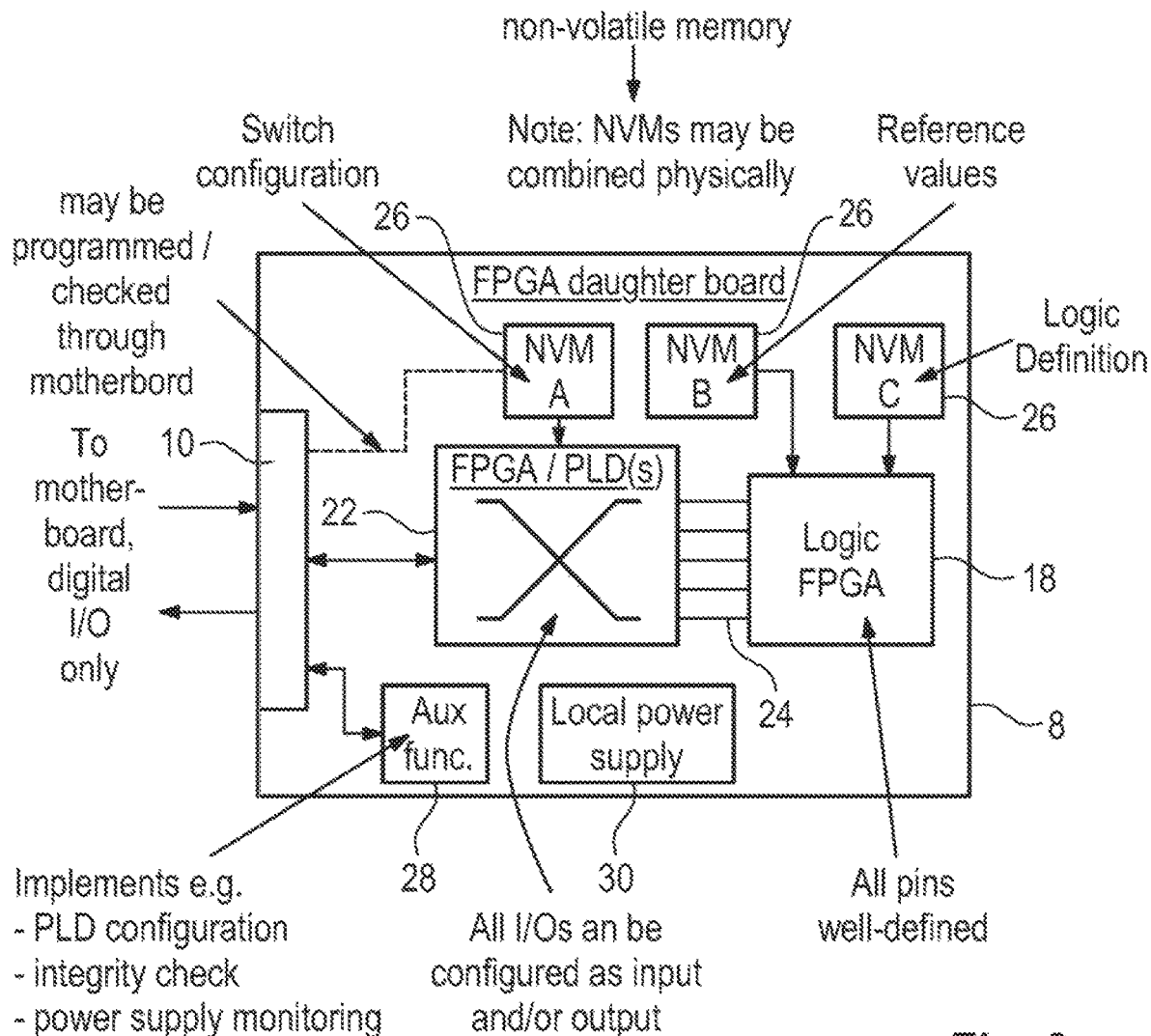
Figure 3:
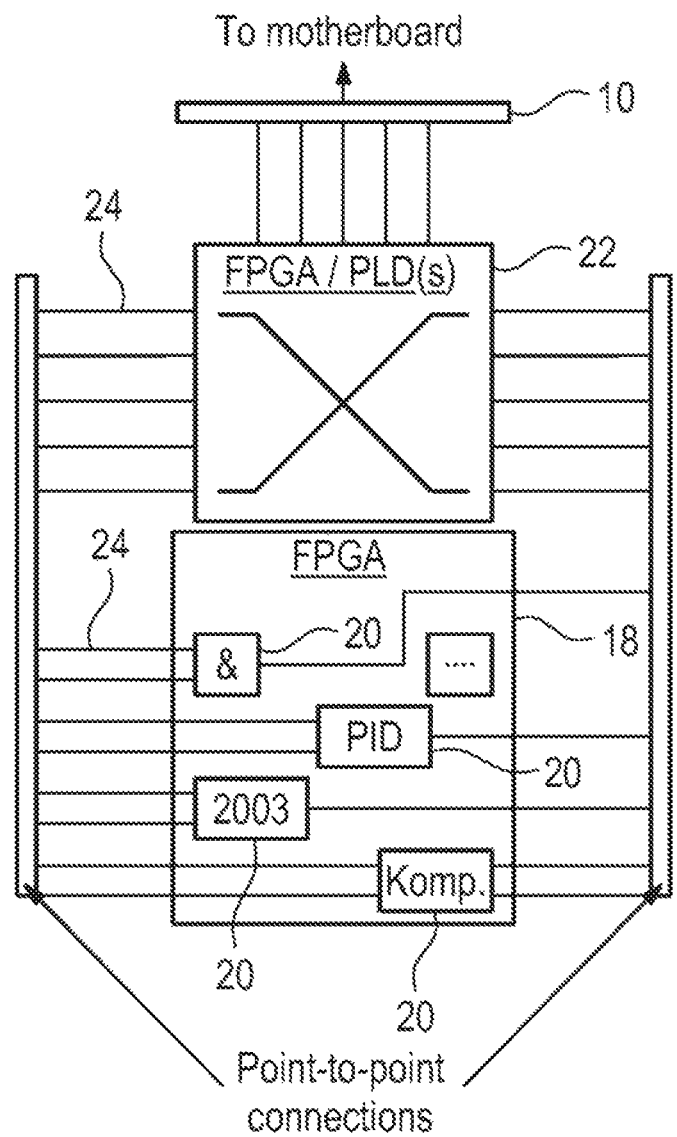

While the logic for safety I&C architectures has traditionally been implemented within CPU-based systems, there is a growing trend towards FPGA-based systems, in particular due to their greater flexibility in the context of complex systems with many parallel input and output signals. However, special care has to be taken in order to comply with the strict demands in the nuclear industry in terms of Verification and Validation (V&V), also called qualification, of the input/output sets and characteristics of the logic devices. FIG. 2 depicts a FPGA-based daughterboard 8 for use with the motherboard 2 of FIG. 1, whose design is particularly well-suited to cope with this problem. FIG. 3 picks an important detail from FIG. 2. Of course, a separate daughterboard may not be necessary if the whole circuitry including periphery and/or external interfaces is implemented on a single main board instead.

As indicated in FIG. 3, the daughterboard 8 holds a generic Field Programmable Gate Array (FPGA) 18 with a large number of logic functions provided by according logic function units 20 or logic function blocks (in short: logic units or logic blocks), in particular simple logic gates and if necessary also more complex function like adders, comparators, Proportional-Integral-Derivative (PID) and other controllers, filters and the like. The logic units 20 therefore may consist of/comprise/combine several elementary logic resources or logic blocks of the FPGA. The FPGA 18 also comprises a set of (re-) configurable internal routing resources (programmable switches) that normally allow for project-specific interconnections of the logic units 20.

However, due to the constraints mentioned above, the FPGA-internal routing resources are not used to connect the logic units 20 with each other in the system according to FIGS. 2 and 3. Instead, a Programmable Logic Device (PLD) 22 whose pins are connected to corresponding pins of the FPGA 18 via circuit tracks 24 of the daughter board 8 (point-to-point connections) acts as an FPGA-external switch-matrix and thus provides the configurable routing functions which are needed for a project-specific interconnection of the FPGA's logic units 20. Hence, the PLD 22 can also be called "auxiliary PLD" or "marshalling PLD" or "switch-matrix PLD" or "switch-PLD".

The PLD 22 which acts as a switch-matrix for the logic units 20 of the generic FPGA 18 may be a custom-fabricated Application Specific Integrated Circuit (ASIC) or a Printed Circuit Board (PCB). In a preferred embodiment, however, it is a (at least one or even several of them) Complex Programmable Logic Device (CPLD), and even more preferably a FPGA which is programmed according to the prevailing project-specific needs and hence provides the necessary interconnections between the logic units 20 of the generic FPGA 18. While the marshalling PLD 22 may contain a considerable amount of logic resources on its own, these are actually not used at all or only in a very limited range at the most. Instead, the actually used features of the auxiliary PLD 22 are essentially restricted to the routing/switch-matrix operations for the generic FPGA 18 as described above. This way, V&V of the corresponding development/programming tools for the PLD 22 is considerably eased as discussed in more detail below.

Preferably, the auxiliary PLD 22 does not only interconnect the logic units 20 of the generic FPGA 18 in a suitable project-specific way but also routes the FPGA's external digital input/output signals from/to the motherboard 2 via the digital I/O interface 10. According to the switch-matrix programmed into the PLD 22, any pin of the FPGA 18 can be configured as input and/or output pin.

The daughterboard 8 may also be equipped with a number of Non-Volatile Memory (NVM) 26 modules. By way of example, one of these NVMs 26 contains the pre-defined switch configuration which is loaded into the PLD 22 during power-up or setup. It may be programmed/checked through the motherboard 2 as indicated by the dotted line in FIG. 2. Another NVM 26 contains the pre-defined logic definitions to be loaded into the FPGA 18 during power-up. A third NVM 26 may contain a set of reference/parameter values to be loaded into the FPGA 18 during power-up. The NVMs 26 may be combined physically.

An auxiliary module 28 may contain certain helper functions, e.g. for PLD configuration, integrity checks or power supply monitoring, including monitoring of the daughter board's local power supply 30. Alternatively, such functions may at least partly be implemented within the PLD 22 as an exception to the general rule not to make use of the PLD's logic resources.

Figure 4:
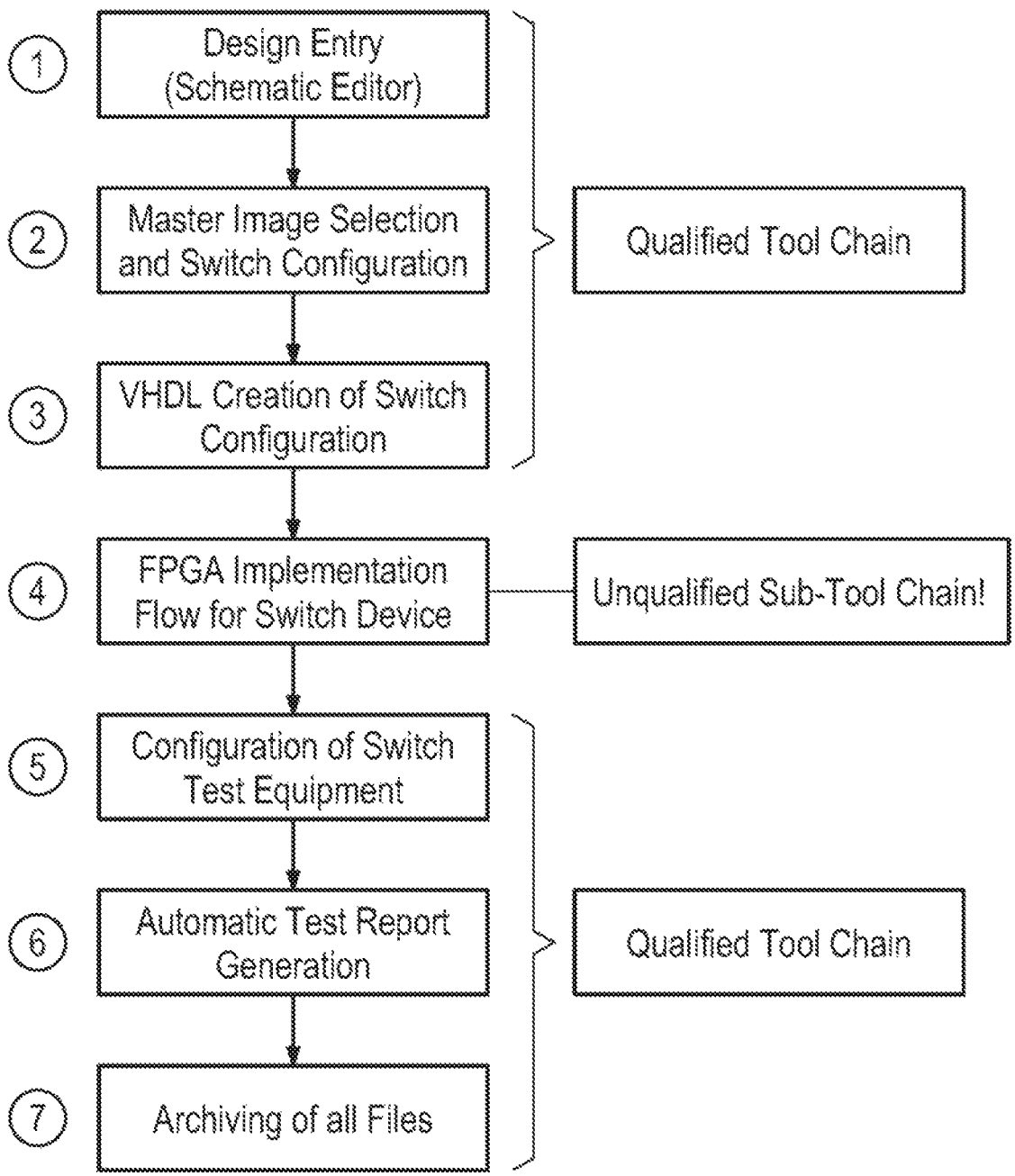

Furthermore, FIG. 4 illustrates an exemplary engineering flow related to the development, programming, and verification of the system illustrated in the previous figures. The contents of the seven boxes of the flow diagram shall be understood in the following way:

1. Design entry is similar to today's methods—a schematic editor (e.g. graphical block diagram editor) is used that allows the creation of diagrams consisting of building blocks (function library, e.g. adder, comparator, voter) that are connected with each other in a project-specific way. The resulting wiring diagram can then follow a proven Verification & Validation (V&V) process that includes manual reviews. At this stage the difference between a wiring diagram that will be implemented on a CPU-based system and one that will be implemented on an FPGA-based systems are not existing or minor.

2. A new piece of software "compiles" this diagram by selecting one or more master FPGAs (partitioning of the resulting design) and determining the necessary pin connections of the used master FPGA images.

3. An automatic VHDL generator creates the needed marshalling matrix code for the FPGA. The resulting VHDL is trivial as it only contains connections and no logic—although as a later option this may change in favor of e.g. some fixed logic blocks in this switch-FPGA that e.g. perform functions like power-up configuration or self-test.

4. The actual configuration bitstream is created by a hard-to-qualify, vendor-specific tool chain including basic V&V mechanisms such as a static timing analysis.

5. The resulting image is downloaded to an independent test hardware that contains the same FPGA device as the final target system and whose sole purpose is the V&V of marshalling FPGAs. This test equipment performs 100% testing of the marshalling FPGA—whereas the term "100%" testing needs to be defined in accordance with relevant authorities and certification agencies. It may become necessary to develop/apply diverse/redundant test systems to preclude common cause errors with regard to the testing equipment. In any case, to check inputs and outputs independently from the tool chain is one reliable way to qualify an otherwise hard-to-qualify tool chain.

6. This test equipment also (semi-) automatically creates a test report that can (automatically) be compared against the specification from step 2.

7. All relevant files are now archived and ready to be used in the final hardware platform.

Finally, while the invention has been mainly described within the context of a safety I&C system for a nuclear power plant other industrial or military applications are of course also feasible.

Glossary

FPGA (Field Programmable Gate Array):
Modern fine-grained programmable Integrated Circuit which is designed to be configured by a customer or a designer after manufacturing—hence "field programmable".

It comprises a number of configurable logic resources (logic blocks) with internal Lookup Tables (LUTs) and flexible routing resources, i.e. a hierarchy of reconfigurable interconnects that allow the blocks to be "wired together". In principle, every logic circuit can be mapped on the resources of a FPGA.

CPLD (Complex Programmable Logic Device):

Old coarse-grained programmable Integrated Circuit which comprises several macrocells (AND- and OR-matrices, flip-flops etc.) In principle, every logic circuit can be mapped on the resources of a CPLD, but due to size limitations it is better suited for simple tasks.

PLD (Programmable Logic Device):

Generic classification term for FPGAs, CPLDs and other programmable logic devices.

VHDL (Very High Speed Integrated Circuit Hardware Description Language):

Language which is used to describe logic circuits, which shall then be mapped on the resources of a PLD. Also usable for the creation of test-benches for PLDs.

CPU (Central Processing Unit):

Main processor (e.g. of a computer) with a fixed instruction set and a sequential work order. A sequence of instructions for a CPU is called program or, on a higher level, software.

ASIC (Application Specific Integrated Circuit):

Chip with a fixed logic design suited for a specific application. CPUs or FPGAs are also ASICs, but as their application is to be programmable by the end user, the end user must program the desired behavior into the chip.

PCB (Printed Circuit Board):

Board consisting of one or more layers to connect mounted components to each other or to connectors. A typical example for a PCB is the mainboard of a computer, where CPU, chipset, memory, connectors etc. are mounted.

Safety I&C (Safety Instrumentation & Control):

System for a safety application, which collects information of the current state of the application (e.g. the temperature in a nuclear power reactor), evaluates this information (e.g. is the temperature in the nuclear reactor above a predefined threshold?) and acts accordingly to keep the application in a safe state (e.g. decrease the power output of a nuclear reactor, when the temperature is too high).

LIST OF REFERENCE SYMBOLS 2 complex logic board/motherboard
4 safety I&C system
6 nuclear power plant
8 daughterboard
10 digital interface
12 input circuit
14 output circuit
16 external I/O
18 FPGA
20 logic function unit/block
22 PLD
24 circuit track
26 NVM
28 auxiliary module
30 local power supply

The invention claimed is:

1. A circuit arrangement disposed on a logic board, the circuit arrangement comprising:
an FPGA including a plurality of logic function units each having inputs and outputs, a set of internal routing resources for interconnections between said inputs and outputs of said logic function units, and a plurality of pins;
at least one application specific PLD having a plurality of pins; and
circuit tracks disposed on the logic board and providing a plurality of connections between said pins of said FGPA and said pins of said PLD;
said internal routing resources of said FPGA not interconnecting said inputs of said logic function units of said FGPA and said outputs of said logic function units of said FGPA; and
said at least one PLD operating as an application-specific, switch-matrix for said connections and for said inputs of said logic function units of said FGPA and said outputs of said logic function units of said FGPA, said switch-matrix located externally from said FGPA.

2. The circuit arrangement according to claim 1, wherein said at least one PLD provides a range of functions being mainly or exclusively restricted to a switch-matrix for said FPGA.

3. The circuit arrangement according to claim 1, wherein said switch-matrix for said logic function units of said FPGA is exclusively provided by said at least one PLD.

4. The circuit arrangement according to claim 1, wherein said FPGA and said at least one PLD are disposed on a common circuit board and pin-wise connected to each other by circuit-tracks.

5. The circuit arrangement according to claim 1, wherein said at least one PLD is precisely one PLD dedicated to said FPGA.

6. The circuit arrangement according to claim 5, wherein said one PLD is a CPLD.

7. The circuit arrangement according to claim 5, wherein said one PLD is a FPGA.

8. The circuit arrangement according to claim 5, wherein said one PLD is an ASIC.

9. The circuit arrangement according to claim 5, wherein said one PLD is disposed on a PCB.

10. The circuit arrangement according to claim 1, wherein said plurality of connections is at least 50.

11. The circuit arrangement according to claim 1, wherein said plurality of connections is greater than 200.

12. A safety I&C system of a nuclear power plant, the safety I&C system comprising at least one circuit arrangement according to claim 1.

13. The circuit arrangement according to claim 1, further comprising a Non-Volatile Memory module containing a pre-defined switch configuration which is loaded into said at least one PLD during power-up or setup.

14. The circuit arrangement according to claim 1, further comprising a Non-Volatile Memory module having predefined logic definitions to be loaded into said FPGA during power-up.

15. The circuit arrangement according to claim 1, further comprising a Non-Volatile Memory module having a set of reference/parameter values to be loaded into said FPGA during power-up.

16. The circuit arrangement according to claim 1, wherein said NVMs are physically combinable.

17. The circuit arrangement according to claim 1, further comprising an auxiliary module having at least one helper function for performing a function selected from the group consisting of PLD configuration, integrity checks, and power supply monitoring.

18. The circuit arrangement according to claim 1, further comprising an auxiliary module having at least one helper function for performing a function selected from the group consisting of PLD configuration, integrity checks, and power supply monitoring including monitoring a local power supply of a daughter board.

19. The circuit arrangement according to claim 1, further comprising at least one helper function for performing a function selected from the group consisting of PLD configuration, integrity checks, and power supply monitoring including monitoring a local power supply of a daughter board, wherein said at least one helper function is at least partially implemented within said at least one PLD.

20. The circuit arrangement according to claim 1, wherein said switch-matrix interconnects said logic function units of said FGPA together.

\* \* \* \* \*